(12) United States Patent
Wu

(10) Patent No.: US 6,413,384 B1
(45) Date of Patent: Jul. 2, 2002

(54) METHOD FOR MAINTAINING THE CLEANNESS OF A VACUUM CHAMBER OF A PHYSICAL VAPOR DEPOSITION SYSTEM

(75) Inventor: Hsiao-Che Wu, Jungli (TW)

(73) Assignee: ProMos Technologies Inc., Hsinchu (TW)

( * ) Notice: Subject to any disclaimer, the term of this patent is extended or adjusted under 35 U.S.C. 154(b) by 0 days.

(21) Appl. No.: 09/725,219

(22) Filed: Nov. 29, 2000

(30) Foreign Application Priority Data

Sep. 21, 2000 (TW) .......................................... 089119527

(51) Int. Cl.[7] .............................................. C23C 14/34
(52) U.S. Cl. ........................... 204/192.15; 204/192.12; 204/192.1
(58) Field of Search .................... 204/192.1, 192.12, 204/192.13, 192.15

(56) References Cited

U.S. PATENT DOCUMENTS

| | | | | |
|---|---|---|---|---|
| 5,380,414 A | * | 1/1995 | Tepman ................. | 204/192.12 |
| 5,632,869 A | * | 5/1997 | Hurwitt et al. ......... | 204/192.12 |
| 5,876,574 A | * | 3/1999 | Hofmann et al. ....... | 204/192.12 |
| 5,914,018 A | * | 6/1999 | Fu et al. ................ | 204/298.12 |
| 5,976,327 A | * | 11/1999 | Tanaka .................. | 204/192.15 |
| 6,030,514 A | * | 2/2000 | Dunlop et al. ......... | 204/298.12 |
| 6,051,113 A | * | 4/2000 | Moslehi ................. | 204/192.12 |
| 6,132,805 A | * | 10/2000 | Moslehi ................. | 204/298.11 |
| 6,156,164 A | * | 12/2000 | Smolanoff et al. ..... | 204/192.12 |
| 6,187,151 B1 | * | 2/2001 | Leiphart ................ | 204/192.12 |
| 6,207,558 B1 | * | 3/2001 | Singhvi et al. ......... | 438/648 |
| 6,228,236 B1 | * | 5/2001 | Rosenstein et al. ..... | 204/298.2 |

* cited by examiner

Primary Examiner—Rodney G. McDonald
Assistant Examiner—Gregg Cantelmo
(74) Attorney, Agent, or Firm—Arent Fox Kintner Plotkin & Kahn, PLLC

(57) ABSTRACT

The invention provides a method using plasma burn-in for maintaining cleanness within a vacuum chamber of a physical vapor deposition system, thereby reducing particles falling upon a processed wafer. When the operation pressure of the plasma for plasma burn-in is elevated above 10 mtorr, the distribution of the plasma is ever changed and able to enter the narrow space between the metal target side surface and an inner wall of the vacuum chamber so as to bombard the nodules on the side surface and to deposit a metal film upon the brittle metal compound film within the vacuum chamber for reducing the number of particles falling upon the wafer.

21 Claims, 5 Drawing Sheets

METHOD FOR MAINTAINING THE CLEANNESS OF A VACUUM CHAMBER OF A PHYSICAL VAPOR DEPOSITION SYSTEM

FIELD OF THE INVENTION

The present invention relates to a method for maintaining the cleanness within a vacuum chamber of a physical vapor deposition system, especially a method using plasma burn-in for maintaining the cleanness within a vacuum chamber of a physical vapor deposition system.

BACKGROUND OF THE INVENTION

Physical vapor deposition method is one of the commonly used methods for depositing metal compound films in semiconductor processes. A metal target is located in a vacuum chamber of the physical vapor deposition system. After supplying a reactive gas and an inert gas into the vacuum chamber and producing a plasma from the reactive gas and the inert gas, the reactive gas derivatives in the plasma react with the metal target, forming metal compound depositing upon a processed wafer.

FIG.1 illustrates a vacuum chamber 1. Taking the physical vapor deposition of titanium nitride as an example, the metal target 4 is made of titanium. In typical, a process kit 9 is provided in the vacuum chamber 1 to prevent titanium and titanium compound from depositing upon the inner wall 15 of the vacuum chamber 1. During a process, a wafer is placed on the susceptor 10 and the reactive gas nitrogen and an inert gas (mostly argon) enter the vacuum chamber 1 through a gas inlet 12. The power supply 14 applies a negative potential on the metal target 4 which is in electrically conductive relationship with an end surface 2 of the vacuum chamber 1. The portions of the vacuum chamber 1 below the insulating material 13, including the opposite end surface 3, the susceptor 10, and the processed wafer are all in electrically conductive relationship and are grounded.

By this arrangement, an electric field is formed at the cavity 7 and a plasma is produced from the nitrogen and the inert gas. The ionized inert gas bombards the surface 5 of the titanium-made metal target to produce titanium particles. These titanium particles react with nitrogen atoms and nitrogen ions formed in the plasma to produce titanium nitride particles. Some of these titanium nitride particles deposit on the wafer, and some of them deposit on the side surface 6 of the titanium-made metal target and on the inner surface 91 of process kit 9. The particles formed in each process tend to stack on particles already attached to the side surface 6 and the inner surface 91. If the stacking process goes on over the time, nodules such as nodule 81 and nodule 82 will form. Since metal compounds, such as titanium nitride, are brittle in nature and nodules 81 and 82 are protrusive in shape and are not dense structurally, peeling particles from the nodules 81 or 82 are very likely to fall on the processed wafer due to the bombardment of the plasma, thus resulting in failure of the processed wafer.

The conventional plasma burn-in method for a vacuum chamber 1 is stated below in this paragraph. After completing a specific number of film deposition processes, an inert gas is supplied into the vacuum chamber 1. Then a plasma is produced from the inert gas to bombard the nodules into small particles and to bombard the metal target 4 for depositing a ductile metal film upon the brittle metal compound film, thereby maintaining the cleanness within the vacuum chamber 1.

In traditional plasma burn-in method, the operation pressure of the inert gas plasma for plasma burn-in process is identical to the operation pressure, 3.0 to 4.0 mtorr, for metal compound film deposition of the wafer process. Referring now to FIG. 3, the plasma distribution at this operation pressure, however, can not effectively bombard the nodule 82 on the side surface 6 of the metal target. The peeling of residue of nodule 82 will still occur and the particle contamination is not substantially improved. It is noted that after the conventional burn-in process, the titanium nitride film on the metal target surface has been removed by argon bombardment due to the plasma burn-in process and it is not desirable. Before performing further wafer processes, argon and nitrogen are supplied into the vacuum chamber 1 and a plasma is produced from argon and nitrogen to nitridize the bombarded surfaces of the titanium target so that a titanium nitride layer is formed on the titanium target. During this operation, the operation pressure of the plasma from argon and nitrogen is between 3.0 mtorr and 4.0 mtorr.

Therefore, a method is desirable for reducing the nodules on the side surface 6 of the metal target so that the number of particles falling upon the processed wafer is minimized and the yield is increased.

People skilled in this art know that when the pressure in the vacuum chamber is elevated, the ion density of the plasma increases but the ion energy decreases and the mean free path of the particles shortens. On the contrary, when the pressure in the vacuum chamber is lowered, the ion density decreases, and the ion energy and the mean free path of the ion increase. The mean free path represents the mean displacement of a particle before a collision with another particle in a vacuum chamber. It is generally believed that one should lower the pressure in the vacuum chamber to increase the mean free path when expecting a particle to enter a narrower space within the vacuum chamber. In this case, to meet the requirements of high integration density, process microminiaturization, current PVD design mostly aims at higher vacuum and large value of mean free path. By doing this, the etch of sub-micron scale to the wafer can be achieved since the earlier collision of the particles is avoided. In coordination with the utilization of ECR (Electron Cyclotron Resonance), ICP (Inductive Coupled Plasma), TCP (Transformer Coupled Plasma), etc., the ion energy and ion density can be further enhanced. For instance, the TCP9400 series poly etch systems produced by LAM Research Corp. are characterized by their utilization of TCP technology to reach high vacuum and high ion density. Before the emergence of the present invention, the trend of improvement of plasma burn-in operation is to achieve high vacuum and high ion density.

SUMMARY OF THE INVENTION

The present invention provides a plasma burn-in method for maintaining the cleanness within a vacuum chamber of a physical vapor deposition. The present invention produces a plasma with the operation pressure greater than 10.0 mtorr from an inert gas. The plasma distribution at this operation pressure reaches the side surface of the metal target. The plasma bombards the nodules within these sections and bombards the metal target to deposit ductile metal film upon the brittle metal compound film. In a preferred embodiment of the present invention, the preferable plasma operation pressure is between 15.0 to 30.0 mtorr.

DETAILED DESCRIPTION OF THE INVENTION

To solve the imperfectness of the traditional plasma bum-in method, the present invention provides a bum-in method using plasma for maintaining the cleanness within the vacuum chamber of the physical vapor deposition system. The physical vapor deposition system is utilized to deposit a metal compound film upon a wafer during wafer processing, and there is a metal target attached on one end surface of the vacuum chamber. The method includes producing a plasma from an inert gas, bombarding a nodule consisting of metal compound particles by the plasma within the vacuum chamber, and bombarding the metal target by the plasma to deposit a metal film upon the metal compound film which is on the inner wall of the vacuum chamber. The invented operation pressure during bum-in operation is selected through the following experiment.

Figure 2:
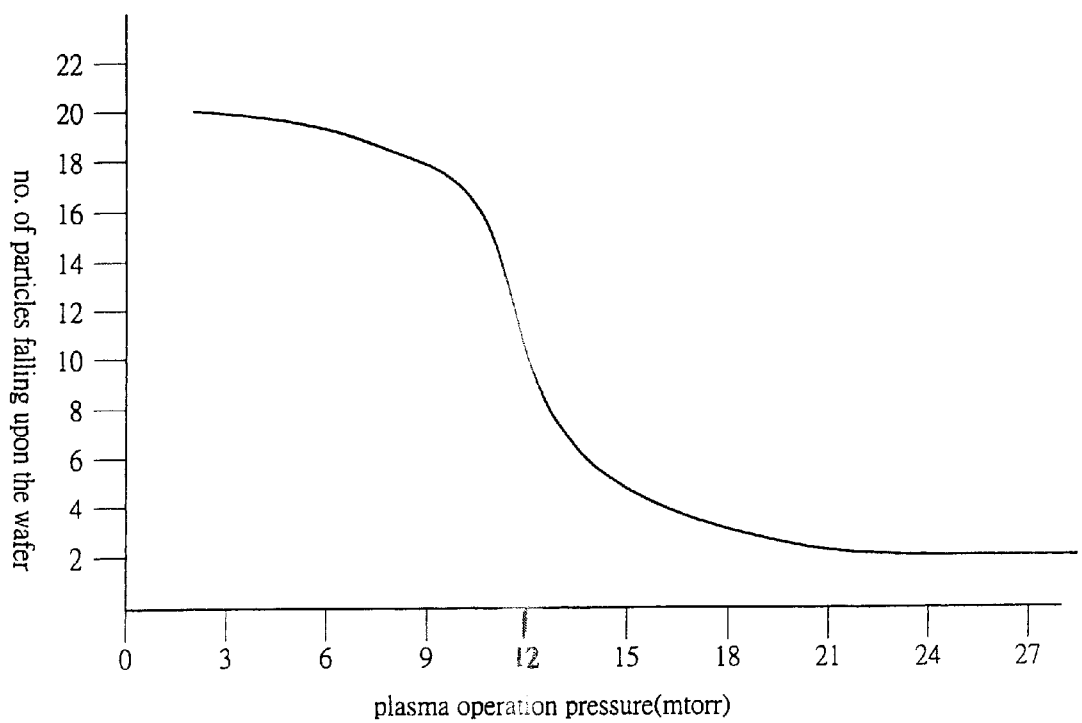
FIG. 2 illustrates the relationship between the number of particles falling on the wafer and the plasma operation pressure of the plasma burn-in according to the invention.
Figure 3:
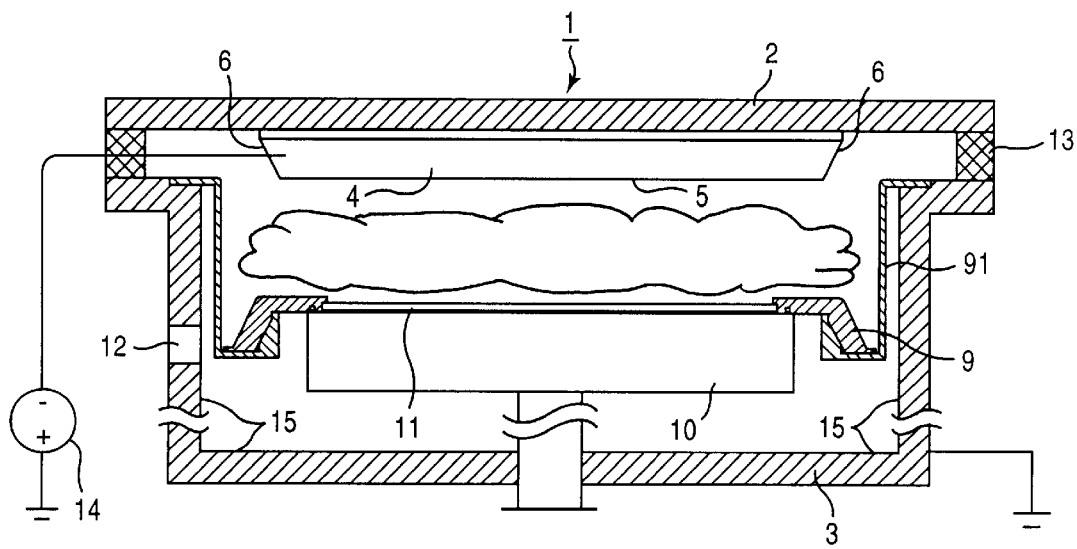
FIG. 3 illustrates the plasma distribution within the vacuum chamber when using a traditional plasma burn-in method.

FIG. 2 illustrates the number of particles falling upon the wafer at distinct operation pressures, in which argon is adopted to produce the plasma and the plasma bum-in cycles remain unchanged. For instance, between two successive bum-in operations, there are either 50 or 125 product wafers completed. The PVD used to obtain FIG. 2 is Endura High Vacuum produced by Applied Materials Corp. The pressure ranges from 3.0 mtorr to about 30.0 mtorr during experiments. We can observe in FIG. 2 that a sharp falling of particle numbers starts around at 10.0 mtorr and the curve gradually goes flat at about 15.0 mtorr. This phenomenon indicates that when the operation pressure of the plasma burn-in operation is elevated above 10.0 mtorr, the number of particles falling upon the wafer declines substantially.

Figure 4:
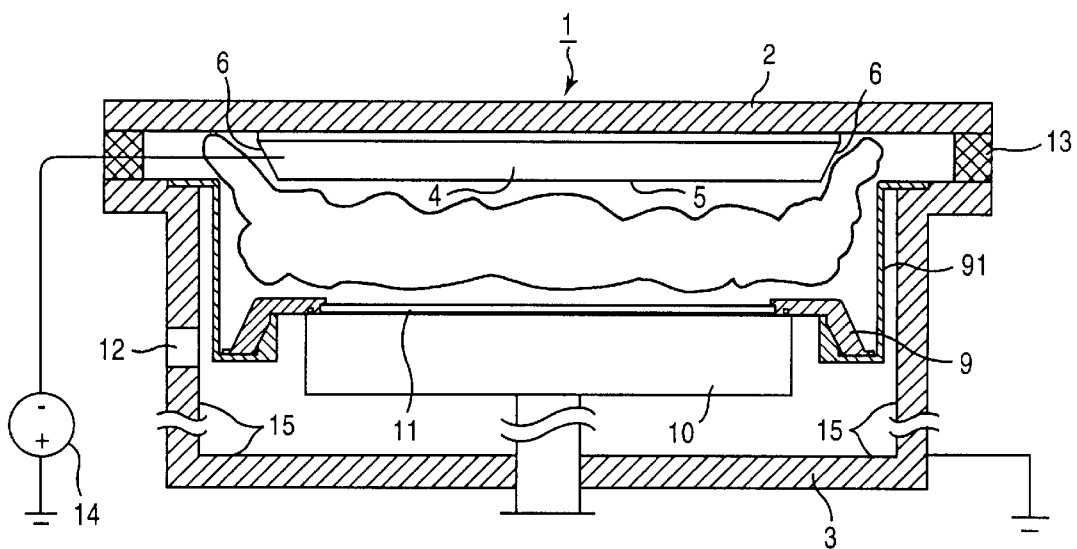
FIG. 4 illustrates the plasma distribution within the vacuum chamber when using the plasma burn-in method of the present invention.

The present invention discovers through experiment that increasing the operation pressure of the plasma alters the plasma distribution within the vacuum chamber and results in what is shown in FIG. 2 as stated above. Referring now to FIG. 4, which illustrates the plasma distribution within the vacuum chamber when using the plasma bum-in method of the present invention with a plasma operation pressure above 10.0 mtorr. The plasma distribution as shown in FIG. 4 easily bombards the nodules 82 located in narrow spaces such as the side surface 6 of the metal target 4 into small particles, and bombards the metal target to generate ductile metal particles. The small particles and the ductile metal particles generated are deposited over the inner wall of the vacuum chamber concurrently. This invention greatly decreases the number of particles falling off from the residue of nodules 82 during wafer production and can minimize the number of occasions of plasma bum-in required. As mentioned in the background section of the specification, it is generally believed that one should lower the operation pressure in the vacuum chamber to increase the mean free path when expecting an ion particle to enter a narrower space within the vacuum chamber. Therefore, the present invention leads to an unexpected result in light of the prior knowledge.

Accordingly, the present invention produces a plasma with operation pressure above 10.0 mtorr from an inert gas within the vacuum chamber 1. The plasma bombards the nodules within the vacuum chamber 1 into small particles and bombards the metal target 4 to generate metal particles so that a ductile metal film is deposited upon the inner surface of the vacuum chamber 1. As the metal target 4 is titanium, the ductile titanium film deposited within the vacuum chamber 1 makes the peeling of titanium nitride film almost impossible. However, in FIG. 2, it is shown the descending curve starts to flatten after 15.0 mtorr and further experiments reveal that when the operation pressure is over 30.0 mtorr, the plasma begins to damage the insulating material 13. In summary, the preferred plasma operation pressure is between 15.0 and 30.0 mtorr.

Figure 5:
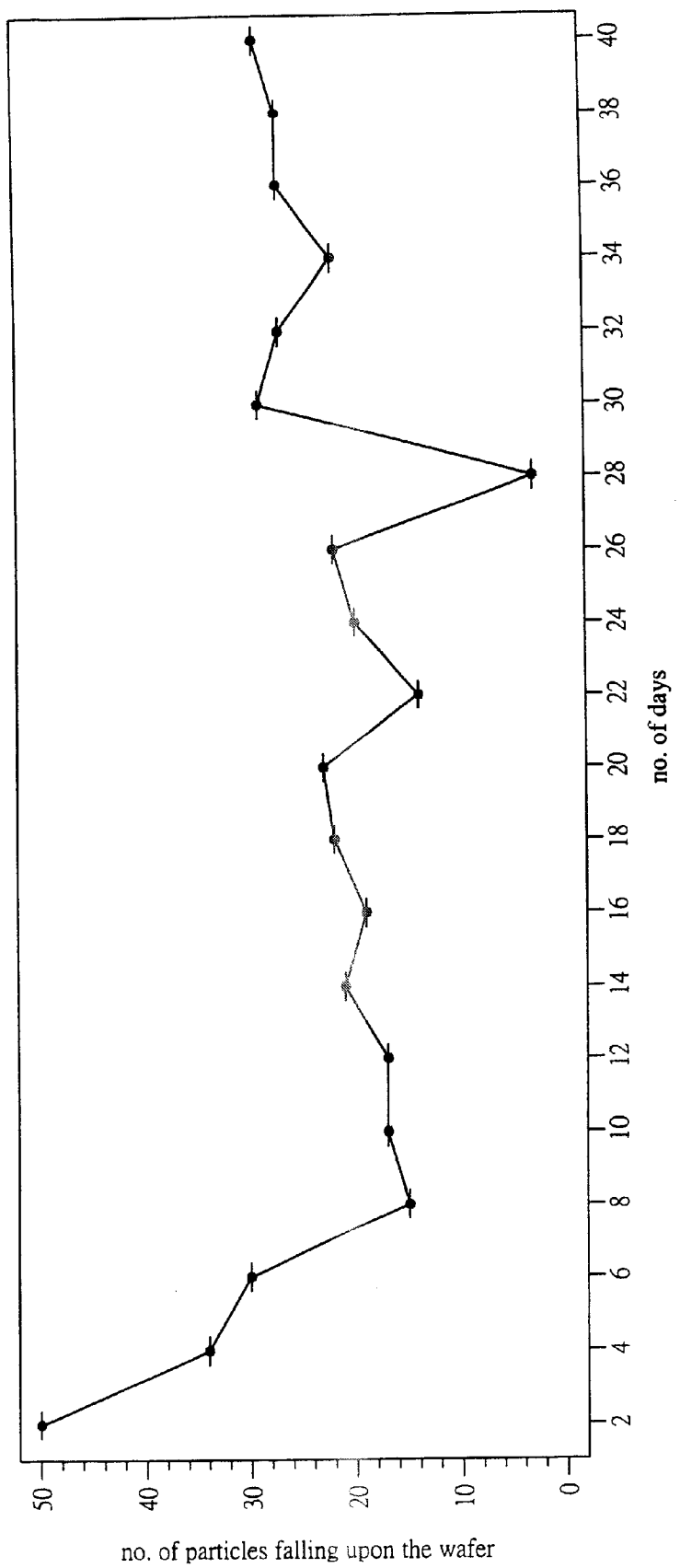
FIG. 5 illustrates the statistic graph of the number of particles falling on the wafer sampled every two days when the operation pressure of the plasma bum-in is at 3.0 mtorr and the plasma burn-in operation is performed once every 50 wafers.
Figure 6:
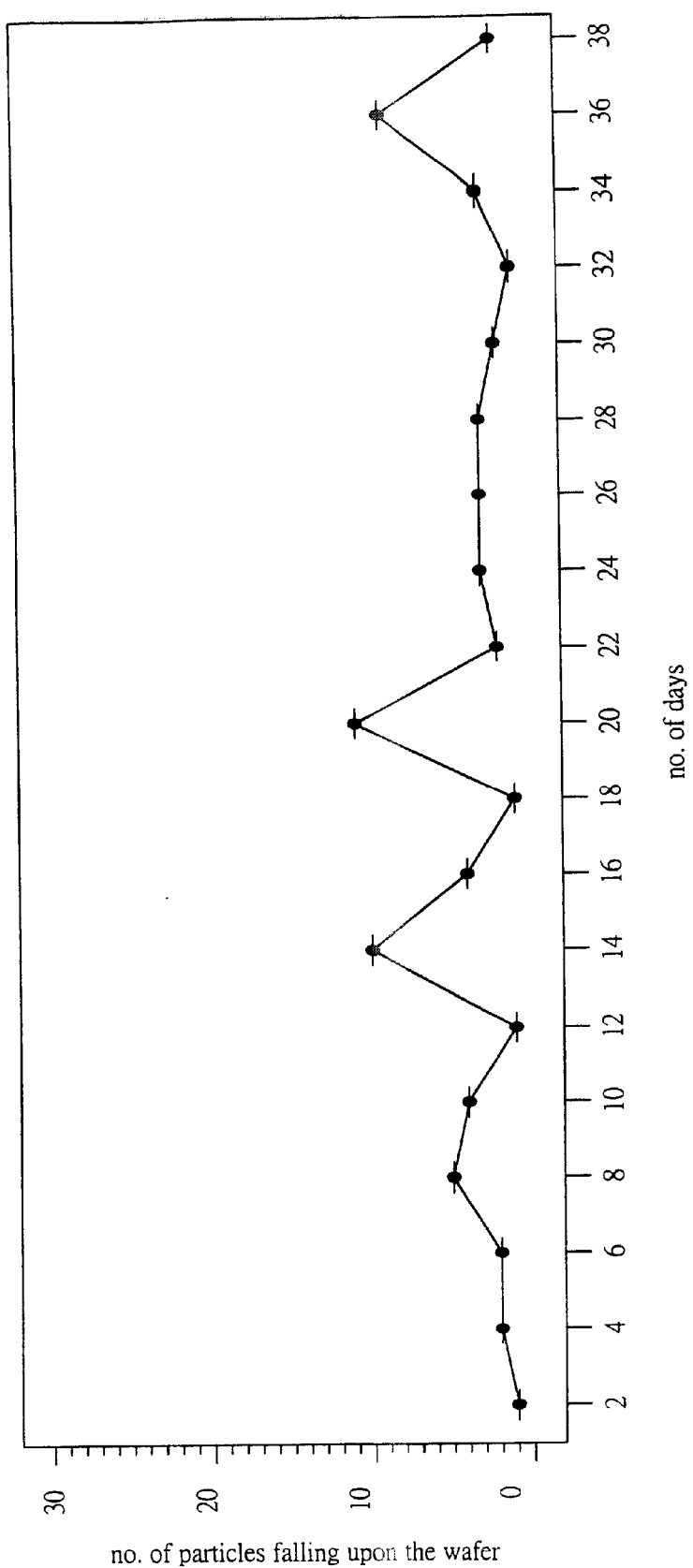
FIG. 6 illustrates the statistic graph of the number of particles falling on the wafer sampled every two days when the operation pressure of the plasma bum-in is at 20.0 mtorr and the plasma bum-in operation is performed once every 125 wafers.

FIG. 5 illustrates the statistic graph of the number of particles falling on the wafer sampled every two days when the operation pressure of the plasma bum-in is at 3.0 mtorr and the plasma bum-in operation is performed once every 50 wafers processed using above mentioned Endura High Vacuum as the PVD machine. FIG. 6 illustrates the statistic graph of the number of particles falling on the wafer sampled every two days when the operation pressure of the plasma bum-in is at 20.0 mtorr and the plasma bum-in operation is performed once every 125 wafers processed using above mentioned Endura High Vacuum as the PVD machine. In FIG. 5, the average number of particles falling on the wafer is 23.333, and in FIG. 6, is 3.526. It is observed that even when the period between two successive plasma bum-in operations becomes longer (from once every 50 wafers to once every 125 wafers), the average number of particles falling on the wafer merely reaches one sixth of that in FIG. 5 or even less, as shown in FIG. 6. Based on this observation, it is concluded that by increasing the operation pressure of plasma bum-in operation to the preferred range of the present invention, the number of particles falling on the wafer indeed is reduced and the period between two successive plasma burn-in operations can be extended.

In addition, the vacuum chamber 1 typically consists of a process kit 9 provided within the vacuum chamber 1 for preventing the small particles from the nodules and the metal particles from depositing on the lower section of inner wall 15 of the vacuum chamber 1. When the metal film or the metal compound film, such as titanium nitride film, accumulates over the inner surface 91 to some extent, the process kit 9 shall be replaced by a new one.

Same as the conventional approach, after the bum-in process of the invention, the titanium nitride film on the metal target surface has been removed by argon bombardment due to the plasma bum-in process and it is not desirable. Before performing further wafer processes, argon and nitrogen are supplied into the vacuum chamber 1 and a plasma is produced from argon and nitrogen to nitridize the bombarded surfaces of the titanium target so that a titanium nitride layer is formed on the titanium target. During this operation, the operation pressure of the plasma from argon and nitrogen is between 3.0 mtorr and 4.0 mtorr.

Figure 1:
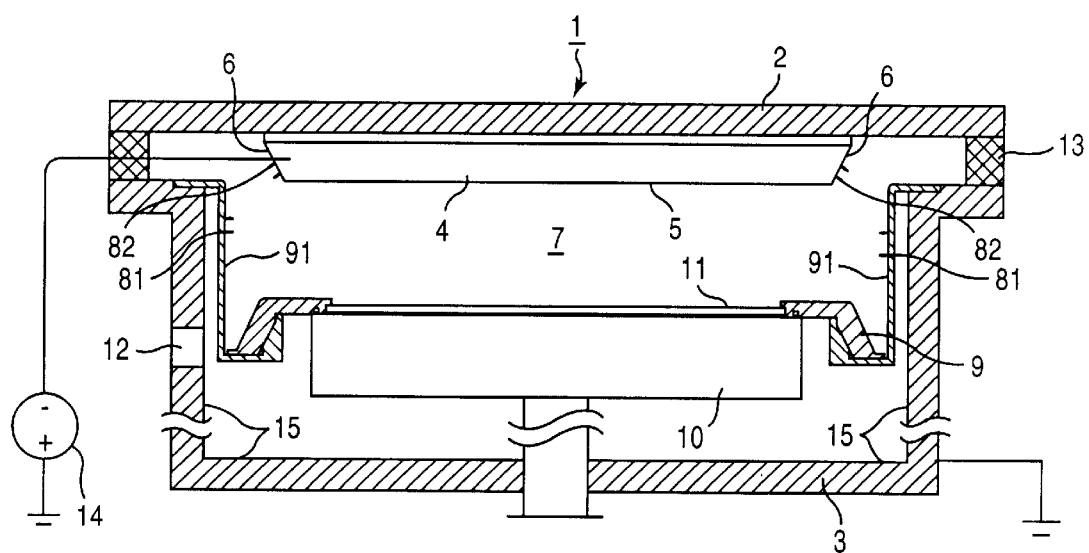
FIG. 1 illustrates a vacuum chamber.

Besides, prior to plasma bum-in operation, the wafer has to be removed. Referring to FIG. 1, a protector 11 may be placed on the susceptor 10 to prevent the small particles peeling from the nodules and the metal particles from depositing on the susceptor 10. In practice, the protector 11 is typically a control wafer or a shutter.

In summary, a protector 11 is placed on the susceptor 10 to protect the susceptor 10 before the plasma bum-in of the present invention begins. In practice, the protector 10 is a control wafer or a shutter. Then an inert gas is supplied through the gas inlet 12 into the vacuum chamber 1. A plasma with operation pressure above 10.0 mtorr is produced from the inert gas within the cavity 7 to bombard the nodule 81 and 82 into small particles and to bombard the metal target 4 to produce metal particles. In the preferred embodiments of the present invention, it is suggested that the plasma operation pressure be between 15.0 mtorr and 30.0 mtorr. When a process kit 9 is provided within the vacuum chamber 1, once the metal film or the metal compound film accumulates over the inner surface 91 to some extent, the process kit 9 shall be replaced by a new one. In the preferred embodiment of the present invention, the inert gas is argon, the metal target 4 is made of titanium and the nodule 81 and 82 consist substantially of titanium nitride.

While this invention has been described in terms of several preferred embodiments, there are many alternatives, and equivalents which fall within the scope of this invention. It should also be noted that there are many alternative ways of implementing the methods and apparatuses of the present invention. It is therefore intended that the following appended claims should be interpreted as including all such alternations and equivalents as fall within the true spirit and scope of the present invention.

We claim:

1. A burn-in method by plasma for maintaining cleanness within a vacuum chamber of a physical vapor deposition system, said vapor deposition system being used for depositing a metal compound film under a first pressure during wafer production, a metal target being attached on one end surface of said vacuum chamber, said vacuum chamber having an inner wall, said burn-in method comprising the steps of:

producing a plasma from an inert gas, wherein a burn-in operation pressure ranges from about 10 mtorr to about 30 mtorr, said burn-in operation pressure being higher than said first pressure;

bombarding nodules over surfaces of the metal target and the inner wall into particles;

depositing said particles over said inner wall of the vacuum chamber;

bombarding said metal target to generate metal particles; and depositing said metal particles over said particles on said inner wall to avoid possible peeling of the nodule during wafer production.

2. The method as recited in claim 1, wherein said burn-in operation pressure of said plasma ranges 15 mtorr to about 30 mtorr.

3. The method as recited in claim 1, wherein said vacuum chamber comprises a process kit provided within said vacuum chamber so that said particles and said metal particles are deposited over an inner surface of said process kit.

4. The method as recited in claim 1, posterior to said step, further comprising the step of:

supplying said inert gas and nitrogen into said vacuum chamber to produce a plasma from said inert gas and nitrogen in order to deposit a nitridated metal film upon a bombarded surface of said metal target under a second pressure.

5. The method as recited in claim 4, wherein said second pressure ranges from about 3 mtorr to about 4 mtorr.

6. The method as recited in claim 1, wherein said vacuum chamber has a susceptor for supporting a wafer, prior to producing said plasma, further comprising the step of:

placing a protector sufficiently large to cover said susceptor.

7. The method as recited in claim 6, wherein said protector is a control wafer.

8. The method as recited in claim 6, wherein said protector is a shutter.

9. The method as recited in claim 1, wherein said inert gas is argon.

10. The method as recited in claim 1, wherein said metal target is made of titanium.

11. The method as recited in claim 1, wherein said nodule substantially consists of particles of titanium nitride.

12. A burn-in method by plasma for maintaining cleanness within a vacuum chamber of a physical vapor deposition system, said vapor deposition system being used for depositing a metal compound film under a first pressure during wafer production, a metal target being attached on one end surface of said vacuum chamber, said vacuum chamber having an inner wall, and a susceptor being provided on another end surface of said vacuum chamber for supporting a wafer, said burn-in method comprising the steps of:

(1) placing a protector upon said susceptor to protect said susceptor;

(2) supplying an inert gas into said vacuum chamber;

(3) producing a plasma from an inert gas, wherein a burn-in operation pressure ranges from about 10 mtorr to about 30 mtorr, said burn-in operation pressure being higher than said first pressure;

(4) bombarding nodules over surfaces of the metal target and the inner wall into particles (5) depositing said particles over said inner wall of the vacuum chamber;

(6) bombarding said metal target to generate metal particles; and (7) depositing said metal particles over said particles on said inner wall to avoid possible peeling of the nodule during wafer production.

13. The method as recited in claim 12, wherein said burn-in operation pressure of said plasma ranges from about 15 mtorr to about 30 mtorr.

14. The method as recited in claim 12, wherein said vacuum chamber comprises a process kit provided within said vacuum chamber so that said particles and said metal particles are deposited over an inner surface of said process kit.

15. The method as recited in claim 12, posterior to step (7), further comprising the step of:

supplying said inert gas and nitrogen into said vacuum chamber to produce a plasma from said inert gas and nitrogen in order to deposit a nitridated metal film upon a bombarded surface of said metal target under a second pressure.

16. The method as recited in claim 15, wherein said second pressure ranges from about 3 mtorr to about 4 mtorr.

17. The method as recited in claim 12, wherein said protector is a control wafer.

18. The method as recited in claim 12, wherein said protector is a shutter.

19. The method as recited in claim 12, wherein said inert gas is argon.

20. The method as recited in claim 12, wherein said metal target is made of titanium.

21. The method as recited in claim 12, wherein said nodule substantially consists of particles of titanium nitride.

* * * * *